United States Patent
Kimura et al.

(10) Patent No.: US 9,774,112 B2
(45) Date of Patent: Sep. 26, 2017

(54) PRESS-FIT TERMINAL, SEMICONDUCTOR DEVICE, POWER CONVERSION APPARATUS AND METHOD OF MANUFACTURING PRESS-FIT TERMINAL

(71) Applicant: Mitsubishi Electric Corporation, Tokyo (JP)

(72) Inventors: Yoshitaka Kimura, Tokyo (JP); Rei Yoneyama, Tokyo (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/070,649

(22) Filed: Mar. 15, 2016

(65) Prior Publication Data

US 2016/0365662 A1 Dec. 15, 2016

(30) Foreign Application Priority Data

Jun. 15, 2015 (JP) .................................. 2015-120421

(51) Int. Cl.
*H01L 23/48* (2006.01)
*H01L 21/00* (2006.01)
(Continued)

(52) U.S. Cl.
CPC ..... *H01R 12/585* (2013.01); *H01L 23/49541* (2013.01); *H01L 23/49551* (2013.01); *H01L 23/49838* (2013.01); *H01R 12/7064* (2013.01); *H01L 2224/48091* (2013.01); *H01L 2224/48137* (2013.01)

(58) Field of Classification Search
CPC .......... H01L 23/4985; H01L 23/49541; H01L 23/49838; H01L 23/49548; H01L 23/49551; H01R 12/585; H01R 12/7064
See application file for complete search history.

(56) References Cited

U.S. PATENT DOCUMENTS 4,864,079 A * 9/1989 Barlow ................ H05K 3/3426
174/533
5,144,412 A * 9/1992 Chang ................... H01L 21/486
257/665
(Continued)

FOREIGN PATENT DOCUMENTS

| EP | 2963684 A1 | 1/2016 |
|---|---|---|
| JP | 2012-151019 A | 8/2012 |
| WO | 2014/132803 A1 | 9/2014 |

*Primary Examiner* — Alonzo Chambliss
(74) *Attorney, Agent, or Firm* — Studebaker & Brackett PC (57) ABSTRACT

A semiconductor device includes a case, a circuit substrate set in the case and having an electric circuit formed thereon, and a plurality of terminals arranged in the case by being spaced apart from each other, each terminal having a base portion electrically connected to the electric circuit in the case, and a trunk portion bent by forming a fold between the base portion and the trunk portion so as to rise from the base portion at the end of the base portion, the trunk portion having a press-fit portion formed at its distal end, wherein the fold is inclined relative to a longitudinal axis of the base portion, and wherein restitution directions in which the press-fit portions restitute from their contractions caused by press fitting are turned aside one from another between each adjacent pair of the terminals.

7 Claims, 9 Drawing Sheets

(51) Int. Cl.
  *H05K 5/02* (2006.01)
  *H01R 12/58* (2011.01)
  *H01L 23/498* (2006.01)
  *H01L 23/495* (2006.01)
  *H01R 12/70* (2011.01)

(56) References Cited

U.S. PATENT DOCUMENTS

| | | | | |
|---|---|---|---|---|
| 6,097,084 A * | 8/2000 | Sano | .................... | H01L 31/167 257/433 |
| 6,309,259 B1 * | 10/2001 | Yamashita | ........... | H01R 12/585 439/439 |
| 7,361,983 B2 * | 4/2008 | Hayashi | ............ | H01L 23/49541 257/666 |
| 8,436,459 B2 * | 5/2013 | Oka | .................... | H01L 23/3735 257/691 |
| 8,742,555 B2 * | 6/2014 | Wen | .................. | H01L 23/49503 257/666 |
| 9,640,453 B2 * | 5/2017 | Egusa | ................... | H01L 23/053 |
| 2004/0145880 A1 * | 7/2004 | Watanabe | .............. | H05K 3/308 361/803 |
| 2008/0158830 A1 * | 7/2008 | Tominaga | ................ | H05K 3/32 361/722 |
| 2009/0096041 A1 * | 4/2009 | Sakakibara | ............. | B81B 7/007 257/419 |
| 2012/0025393 A1 * | 2/2012 | Kirsch | ................. | H01L 23/047 257/773 |
| 2012/0098138 A1 * | 4/2012 | Oka | ....................... | H01L 21/56 257/773 |
| 2012/0115339 A1 * | 5/2012 | Schaarschmidt | .... | H01R 12/585 439/66 |
| 2012/0187554 A1 | 7/2012 | Oka et al. | | |
| 2012/0190242 A1 * | 7/2012 | Kataoka | ............... | H01R 12/585 439/626 |
| 2014/0038363 A1 * | 2/2014 | Haba | ..................... | H01L 21/565 438/123 |

* cited by examiner

PRESS-FIT TERMINAL, SEMICONDUCTOR DEVICE, POWER CONVERSION APPARATUS AND METHOD OF MANUFACTURING PRESS-FIT TERMINAL

BACKGROUND OF THE INVENTION

Field of the Invention

The present invention relates to a press-fit terminal, a semiconductor device, a power conversion apparatus and a method of manufacturing the press-fit terminal.

Background Art

As an ordinary method for making connections between a printed circuit board (PCB) and external terminals, a method of inserting terminals with solder in through holes and thereafter soldering the terminals has been used. With the increasing demand for solderless connection in recent years, however, attention is being focused not on the soldering method but on press-fit joining. In press-fit joining, contacts between a printed circuit board and terminals are made by contract stress in press-fit terminals.

A technique of providing a constriction structure in portion of a press-fit terminal is described, for example, in FIG. 8 of International Publication No. WO 2014/132803. A surface of a press-fit portion can be directed at a desired angle by twisting the press-fit portion on this constriction structure.

The above-described conventional structure allows stress to act on the press-fit terminal by twisting. Excess stress is caused in contrast with the case where the terminal is not twisted, resulting in a reduction in strength of the press-fit terminal.

SUMMARY OF THE INVENTION

In view of the above-described problem, an object of the present invention is to provide a press-fit terminal capable of directing a surface of a press-fit portion at a desired angle and having a high strength, a semiconductor device having the press-fit terminal, a power conversion apparatus and a method of manufacturing the press-fit terminal.

The features and advantages of the present invention may be summarized as follows.

According to one aspect of the present invention, a semiconductor device includes a case, a circuit substrate set in the case and having an electric circuit formed thereon, and a plurality of terminals arranged in the case by being spaced apart from each other, each terminal having a base portion electrically connected to the electric circuit in the case, and a trunk portion bent by forming a fold between the base portion and the trunk portion so as to rise from the base portion at the end of the base portion, the trunk portion having a press-fit portion formed at its distal end, wherein the fold is inclined relative to a longitudinal axis of the base portion, and wherein restitution directions in which the press-fit portions restitute from their contractions caused by press fitting are turned aside one from another between each adjacent pair of the terminals.

According to another aspect of the present invention, a power conversion apparatus includes at least one semiconductor device, the semiconductor device includes a case, a circuit substrate set in the case and having an electric circuit formed thereon, and a plurality of terminals arranged in the case by being spaced apart from each other, each terminal having a base portion electrically connected to the electric circuit in the case, and a trunk portion bent by forming a fold between the base portion and the trunk portion so as to rise from the base portion at the end of the base portion, the trunk portion having a press-fit portion formed at its distal end, wherein the fold is inclined relative to a longitudinal axis of the base portion, and wherein restitution directions in which the press-fit portions restitute from their contractions caused by press fitting are turned aside one from another between each adjacent pair of the terminals.

According to another aspect of the present invention, a method of manufacturing a press-fit terminal includes a step of forming, by punching a metal plate with a die, a press-fit terminal plate in flat plate form having a base portion, a trunk portion connected to an end of the base portion and a press-fit portion provided on a distal end of the trunk portion, a longitudinal direction of the trunk portion being inclined relative to a longitudinal direction of the base portion, and a step of forming a press-fit terminal by bending the base portion and the trunk portion of the press-fit terminal plate relative to each other so that the trunk portion rises from the base portion at the end of the base portion, and so that a fold formed by bending is oblique to a longitudinal axis of the base portion.

According to another aspect of the present invention, a press-fit terminal includes a base portion, and a trunk portion bent by forming a fold between the base portion and the trunk portion so as to rise from the base portion at the end of the base portion, the trunk portion having a press-fit portion formed at its distal end, wherein the fold is inclined relative to a longitudinal axis of the base portion.

Other and further objects, features and advantages of the invention will appear more fully from the following description.

DETAILED DESCRIPTION OF THE PREFERRED EMBODIMENTS

A comparative example to be compared with an embodiment of the present invention will first be described.

Figure 8:
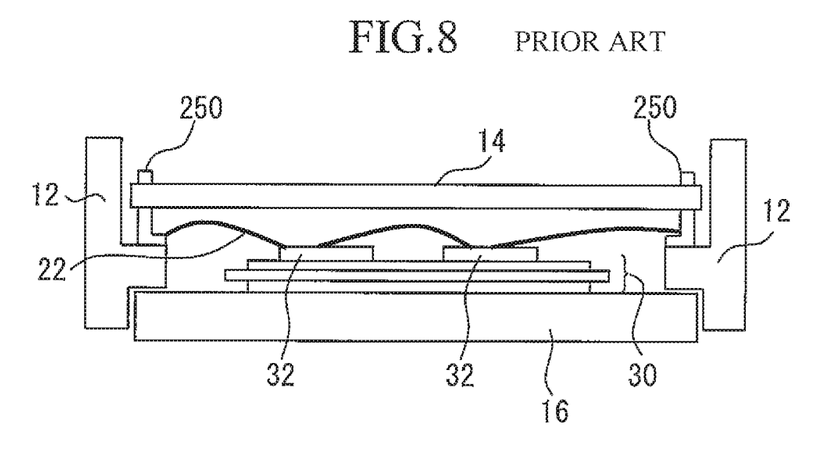
FIG. 8 is a diagram showing a semiconductor device according to the comparative example.
Figure 9:
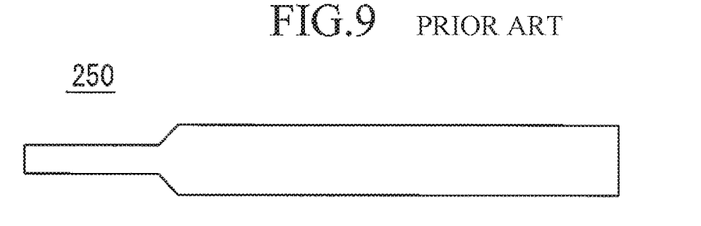
FIG. 9 is a diagram showing a soldering terminal according to the comparative example.
Figure 10:
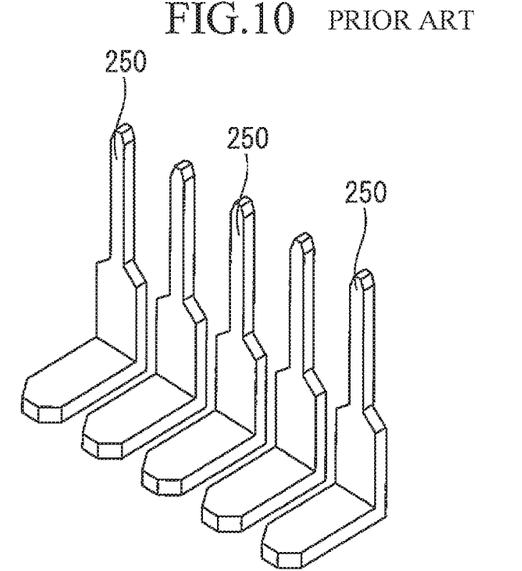
FIG. 10 is a diagram showing a soldering terminal according to the comparative example.

FIG. 8 is a diagram showing a semiconductor device according to the comparative example to be compared with the embodiment. FIG. 8 shows the internal structure of an intelligent semiconductor device (IPM) incorporating a printed circuit board 14. FIGS. 9 and 10 are diagrams showing a soldering terminal 250 (relay terminal 250) according to the comparative example to be compared with the embodiment. The semiconductor device shown in FIG. 8 has a case 12, a base plate 16 made of copper, semiconductor elements (semiconductor chips) 32, a substrate (insulating substrate) 30, and wires 22. The soldering terminals 250 and the semiconductor elements 32 are electrically connected to each other by the wires 22.

With the increasing demand for solderless connection in recent years, however, attention is being focused not on a soldering method such as described above but on press-fit joining. A press-fit portion 154 for press-fit joining has a width larger than the diameter of a through hole 14h. Press-fit terminals 150 are inserted in through holes 14h in the printed circuit board 14, thereby causing contact stress in press-fit portions 154. The press-fit terminals 150 and the printed circuit board 14 can be solderlessly connected by causing this contact stress.

Figure 11:
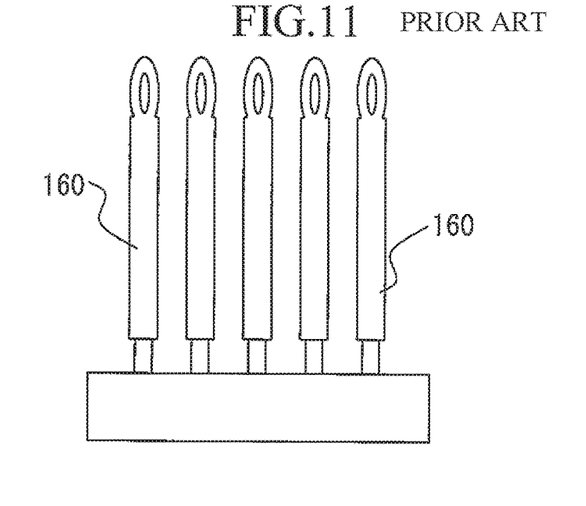
FIG. 11 is a diagram showing a press-fit terminal plate according to the comparative example.
Figure 12:
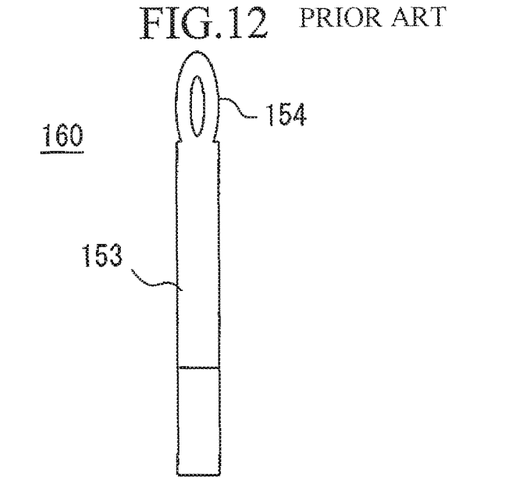
FIG. 12 is a diagram showing a press-fit terminal plate according to the comparative example.
Figure 13:
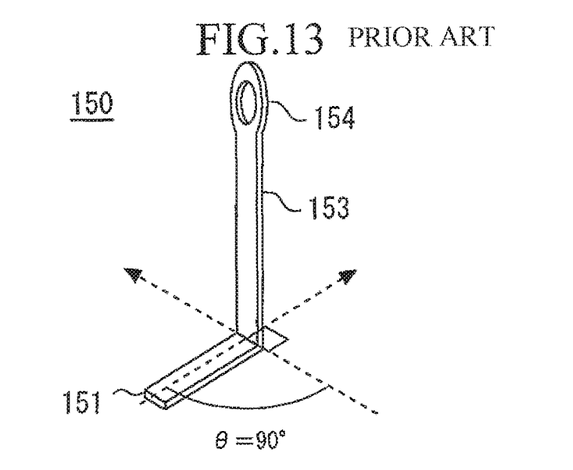
FIG. 13 is a diagram showing a press-fit terminal according to the comparative example.
Figure 14:
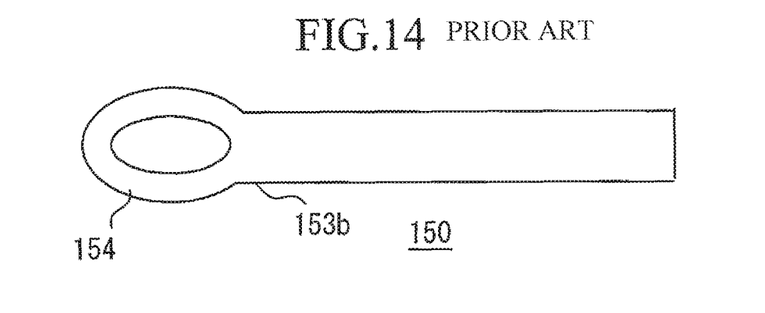
FIG. 14 is a diagram showing a press-fit terminal according to the comparative example.

FIGS. 11 and 12 are diagrams showing a press-fit terminal plate 160 according to the comparative example to be compared with the embodiment. A plurality of the press-fit terminal plates 160 shown in FIG. 12 can be collectively formed by punching a metal plate with a die, as shown in FIG. 11. FIGS. 13 and 14 are diagrams showing the press-fit terminal 150 according to the comparative example to be compared with the embodiment. The press-fit terminal 150 having a base portion 151, a trunk portion 153 and the press-fit portion 154 can be obtained by bending the press-fit terminal plate 160 into the shape of L, as shown in FIG. 13. As shown in FIG. 14, a trunk portion 153b smaller in width than the trunk portion 153 shown in FIG. 12 may alternatively be provided. The trunk portion 153b is made smaller in width than the press-fit portion 154 and there is no such constricted portion (no smaller-width portion) as that between the trunk portion 153 and the press-fit portion 154 shown in FIG. 12.

Figure 15:
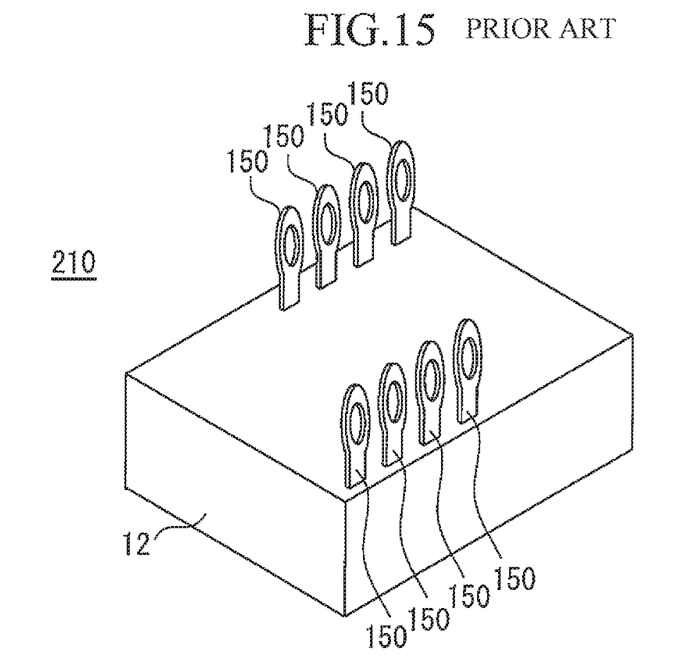
FIG. 15 is a diagrams showing semiconductor devices according to the comparative example.
Figure 16:
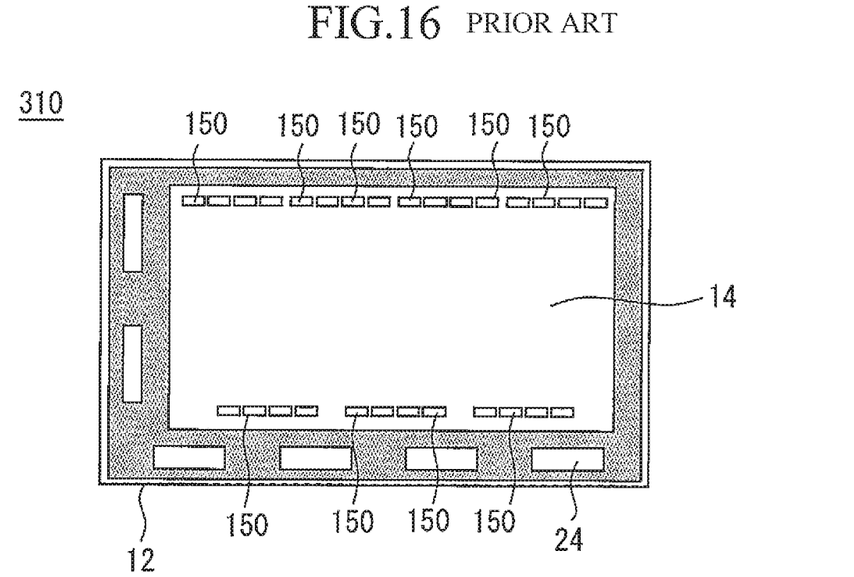
FIG. 16 is a diagram showing semiconductor devices according to the comparative example.
Figure 17:
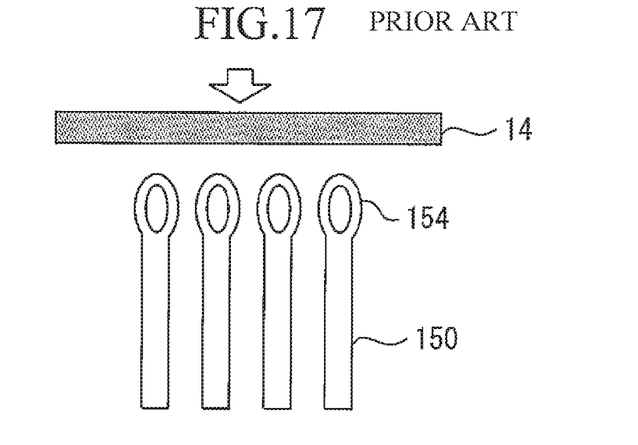
FIG. 17 is a diagram for explaining the action of the press-fit terminals according to the comparative example.

FIGS. 15 and 16 are diagrams showing semiconductor devices 210 and 310 according to the comparative example to be compared with the embodiment. The device shown in FIG. 15 uses the press-fit terminals 150 as external signal terminals. The device shown in FIG. 16 uses the press-fit terminals 150 as internal signal terminals.

Figure 18:
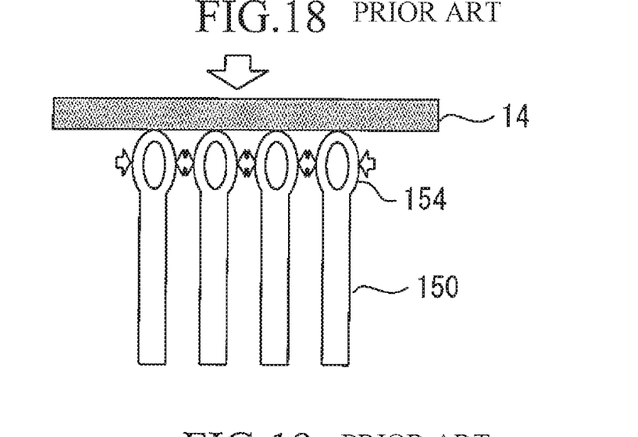
FIG. 18 is a diagram for explaining the action of the press-fit terminals according to the comparative example.
Figure 19:
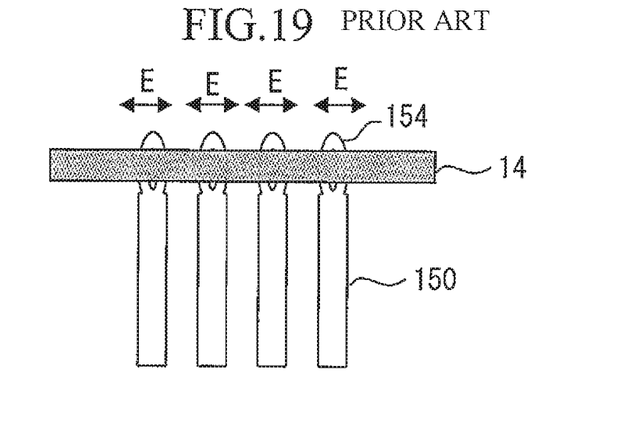
FIG. 19 is a diagram for explaining the action of the press-fit terminals according to the comparative example.

FIGS. 17 to 21 are diagrams for explaining the action of the press-fit terminals 150 according to the comparative example to be compared with the embodiment. When the printing circuit board 14 is pressed for fitting from the state shown in FIG. 17, the press-fit terminals 150 are inserted in the through holes 14h while the press-fit portions 154 of the press-fit terminals 150 are squeezed, as shown in FIG. 18. The press-fit terminals 150 are inserted in the through holes 14h. Thereafter, electrical connections between the printed circuit board 14 and the press-fit terminals 150 are established by the elastic force of the press-fit portions 154.

Figure 20:
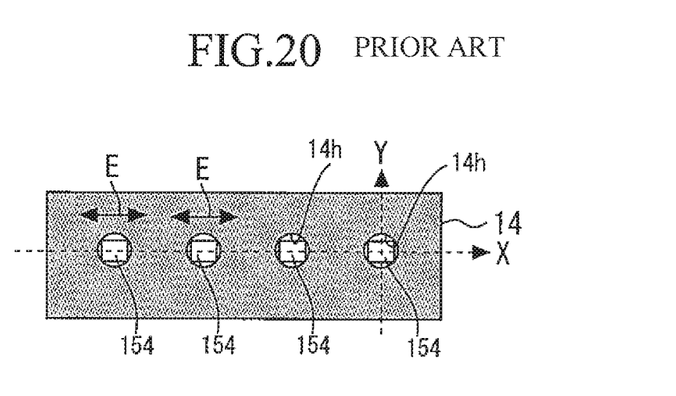
FIG. 20 is a diagram for explaining the action of the press-fit terminals according to the comparative example.
Figure 21:
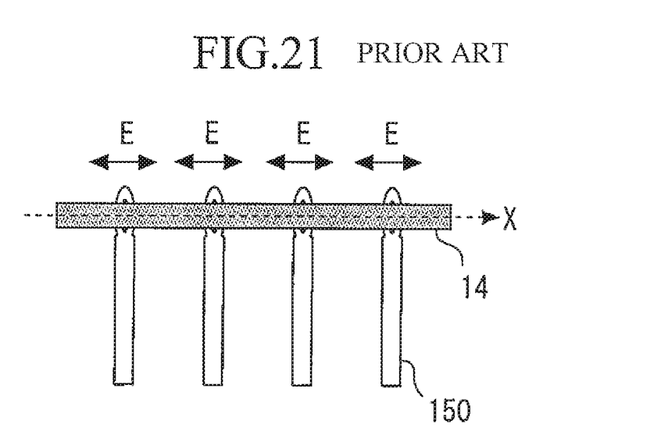
FIG. 21 is a diagram for explaining the action of the press-fit terminals according to the comparative example.

FIGS. 20 and 21 are diagrams for explaining the action of the press-fit terminals 150 according the comparative example. FIGS. 20 and 21 show a state where the press-fit terminals 150 are fitted in the through holes 14h of the printed circuit board 14 to establish electrical connections. FIG. 20 is a plan view of the printed circuit board 14, and FIG. 21 is side view of the printed circuit board 14 shown in FIG. 20.

A case where the press-fit terminals 150 are disposed parallel to the direction X in which the through holes 14h are arranged, as in the comparative example shown in FIGS. 20 and 21, will be discussed. In this case, restitution directions E in which the press-fit portions 154 respectively restitute from their contractions caused by press fitting are aligned with each other along the direction X. By the elastic force (restitutive force) of the press-fit portions 154, contact stresses are caused at the through holes 14h in which the press-fit terminals 150 are inserted. If the plurality of through holes 14h are disposed close to each other, stresses are concentrated in portions between the through holes 14h in the printed circuit board 14. In order to sufficiently resist this stress concentration, each of adjacent pairs of the press-fit portions 154 and pairs of through holes 14h should be spaced apart from each other to a certain extent in the arrangement shown in FIGS. 20 and 21. There is, therefore, a problem that when a user having purchased the semiconductor device 210 designs a user-side circuit board to be assembled on the semiconductor device 210, the reduction of the pitch between the through holes 14h in the user-side circuit board is impeded and the miniaturization of the unit designed on the user side is inhibited.

As described above, with the press-fit terminals 150, there are two problems: (1) the stress concentration in the portions of the printed circuit board 14 around the through holes 14h that the press-fit terminals 150 contact, and (2) the impediment to the reduction of the pitch between the through holes 14h.

As a related art for solving these problems, a technique according to International Publication No. WO 2014/132803 may be used, because if the direction of arrangement of the through holes 14h and the longitudinal directions of cross sections of the press-fit terminal 150 are not parallel to each other, stresses caused when the press-fit terminals 150 are inserted in the printed circuit board 14 can be lightened.

When assumed to the press-fit terminal according to International Publication No. WO 2014/132803, however, each press-fit terminal 150 is stressed by being twisted. Excess stress is thereby given in comparison with the case where the press-fit terminal 150 is not twisted. There is, therefore, a problem of the strength of the press-fit terminal 150 being reduced. For example, in the case where each press-fit terminal is twisted as in the construction according to International Publication No. WO 2014/132803, a procedure is conceivable in which each press-fit terminal 150 is inserted in a case and a distal end portion of the press-fit terminal 150 is thereafter chucked with a twisting jig or the like and twisted so that the distal end (press-fit portion) is at the desired angle. In this way, working into the press-fit terminal 150 having the surface of the press-fit portion 154 directed at the desired angle can be performed. However, the constricted portion is stressed by twisting and there is a possibility of the press-fit terminal 150 being cracked or reduced in strength.

The embodiment of the present invention will subsequently be described.

Figure 1:
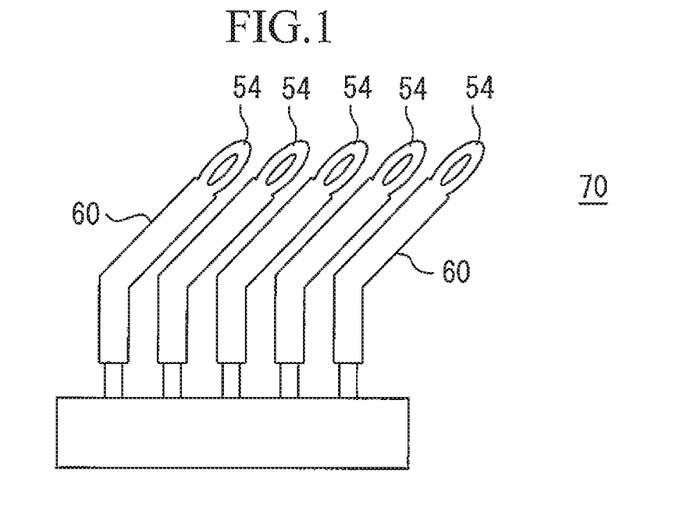
FIG. 1 is a diagram showing press-fit terminal plate according to the embodiment of the present invention.
Figure 2A:
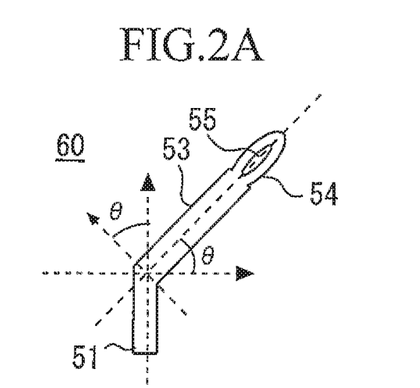
FIG. 2A is a diagram showing press-fit terminal plate according to the embodiment of the present invention.

FIGS. 1 and 2 are diagrams showing press-fit terminal plates 60 according to the embodiment of the present invention. A method of manufacturing press-fit terminals 50 will be described. A flat member 70 in a shape shown in FIG. 1 is formed by punching a metal plate with a die. A press-fit terminal plate 60 shown in FIG. 2A is formed by being separated from the flat member 70.

Figure 2B:
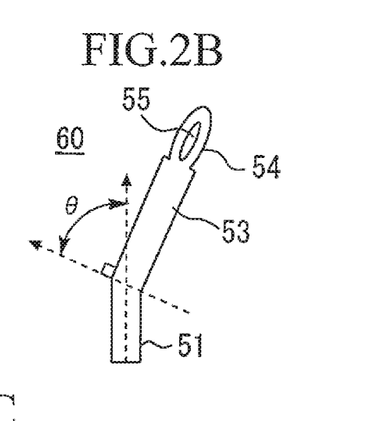
FIG. 2B is a diagram showing press-fit terminal plate according to the embodiment of the present invention.
Figure 2C:
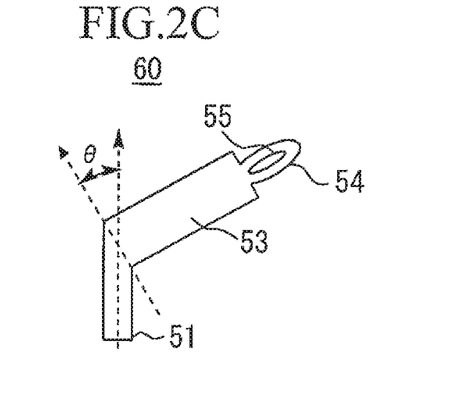
FIG. 2C is a diagram showing press-fit terminal plate according to the embodiment of the present invention.

FIGS. 2A to 2C are developed plan views of press-fit terminal plates 60 according to the embodiment of the present invention. A base portion 51 has a lengthwise shape. The longitudinal direction of a trunk portion 53 intersects the longitudinal direction of the base portion 51. The two longitudinal axes of these portions form an angle θ. When the trunk portion 53 is bent, the angle formed between the longitudinal direction of the base portion 51 and a fold between the base portion 51 and the trunk portion 53 is not 90'; the fold is oblique to the longitudinal direction of the base portion 51. In the press-fit terminal plates 60, the base portion 51 is a "first flat portion" in a lengthwise shape and the trunk portion 53 is a "second flat portion". The second flat portion is a lengthwise flat portion connected to an end of the first flat portion to form a flat member in association with the first flat portion, the second flat portion inclining in the longitudinal direction of the first flat portion. A press-fit portion 54 is provided on the distal end of the second flat portion. The press-fit terminals 50 shown in FIGS. 2A to 2C have angles θ different from each other. Dies for punching out the press-fit terminal plates 60 having the desired angles θ as shown in FIGS. 2A to 2C may be designed by determining the desired angles θ in advance.

Figure 3A:
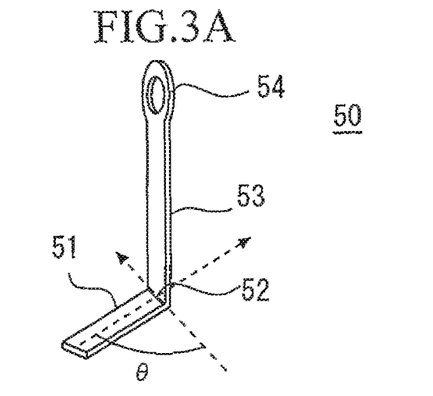
FIG. 3A shows a press-fit terminal.

After the press-fit terminal plate 60 having the desired angle θ is made, the base portion 51 and the trunk portion 53 of the press-fit terminal plate 60 are bent relative to each other. These portions are bent so that the trunk portion 53 rises from the base portion 51 at the end of the base portion 51, and so that a fold 52 is oblique to the longitudinal axis of the base portion 51. The press-fit terminal 50 shown in FIG. 3 can be formed in this way. In the present embodiment, the press-fit terminal 50 punched out with a die is bent as shown in FIG. 3, and the press-fit terminal 50 having an angle θ between the longitudinal direction of the base portion 51 and the fold 52 different from 90° can thereby be obtained without being twisted. No particular connection method is specified as a method for thereafter connecting the base portion 51 to a circuit substrate or the like. A connection method using, for example, soldering or wire bonding may be used.

FIGS. 3A to 3C are diagrams showing the press-fit terminal 50 according to the embodiment of the present invention. As shown in FIG. 3A, the press-fit terminal 50 has the base portion 51 and the trunk portion 53. For example, in a semiconductor device 110 described below with reference to FIG. 5, an electric circuit (more specifically, an electric circuit including a semiconductor element 32 such as an IGBG, a MOSFET or a diode) on a substrate 30 incorporated in a case 12 and the base portions 51 are electrically connected to each other, for example, by wire bonding. The trunk portion 53 is bent by forming the fold 52 between the base portion 51 and the trunk portion 53 so as to rise from the base portion 51 at the end of the base portion 51. The trunk portion 53 has the press-fit portion 54 formed on its distal end. As shown in FIG. 3A, the fold 52 is inclined relative to the longitudinal axis of the base portion 51. The press-fit portion 54 has the shape of an elliptical ring with a central through hole 55. The press-fit portion 54 is made of a metal and has elasticity. When press-fitted, the press-fit portion 54 in the form of the elliptical ring is elastically deformed to contract in a direction along the ellipsoid minor axis. The press-fit portion 54 thereby contracts and becomes thinner. Contact stress is caused in its portions in contact with the printed circuit board 14 by the elastic force of the press-fit portion 54.

Figure 3B:
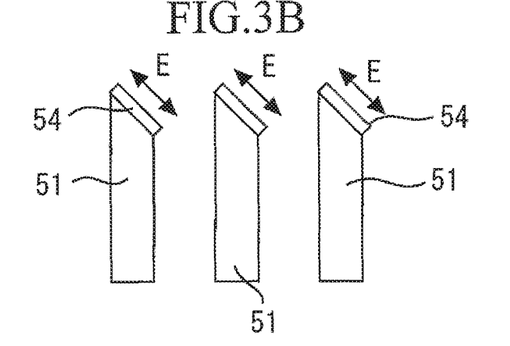
FIG. 3B shows a row of a plurality of press-fit terminals.
Figure 3C:
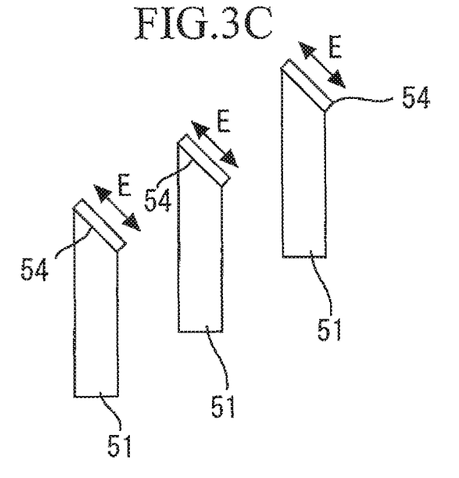
FIG. 3C shows a row of a plurality of press-fit terminals.
Figure 6:
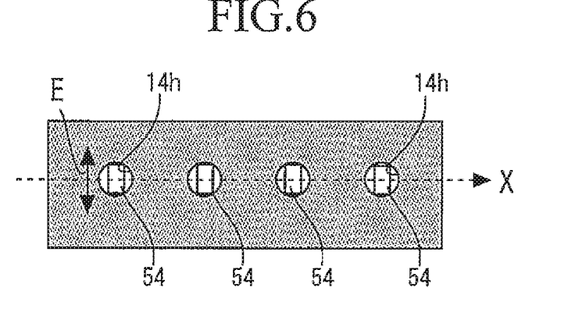
FIG. 6 is a plan view of the printed circuit board.

FIGS. 3B and 3C show examples of a row of a plurality of press-fit terminals 50. As shown in FIGS. 3B and 3C, restitution directions E in which the press-fit portions 54 restitute from their contractions caused by press fitting are turned aside one from another so as not to be aligned with each other between each adjacent pair of the press-fit terminals 50. More specifically, the restitution directions E of the press-fit portions 54 can be set perpendicular to the X-axis corresponding to the through hole arrangement direction, as shown in FIG. 6. This is contrastive to the case of the comparative example shown in FIG. 20, in which the restitution directions E are aligned with each other.

Figure 4:
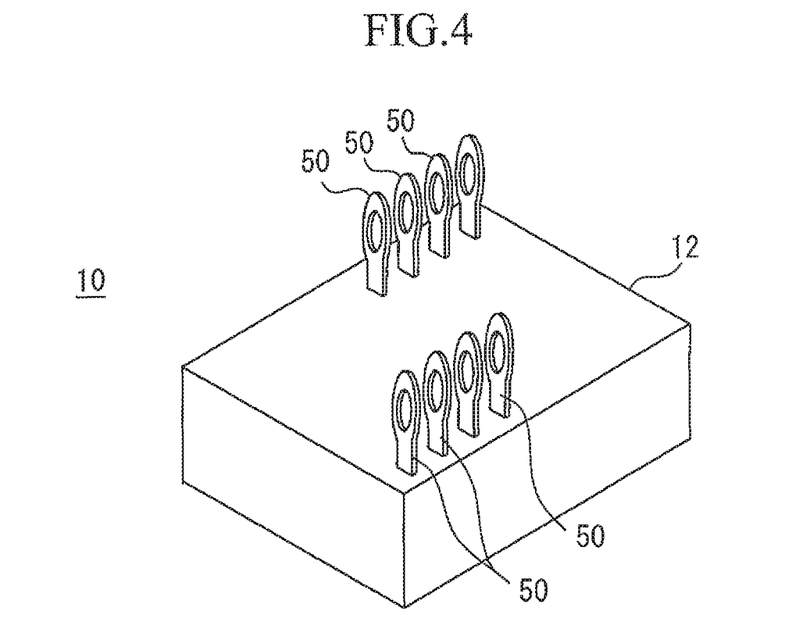
FIG. 4 is a diagram showing a semiconductor device according to the embodiment of the present invention.

FIG. 4 is a diagram showing a semiconductor device 10 according to the embodiment of the present invention. As shown in FIG. 4, a semiconductor device using press-fit terminals 50 as external signal terminals may be provided. The semiconductor device 10 has a case 12, a circuit board (not shown) which is set in the case 12 and on which an electric circuit is formed, and a plurality of press-fit terminals 50 arranged in the case 12 while being spaced apart from each other. The case 12 may be in the form of a box or a transfer mold resin. The press-fit portions 54 of the plurality of press-fit terminals 50 project out of the case 12 from an upper surface of the case 12.

Figure 5:
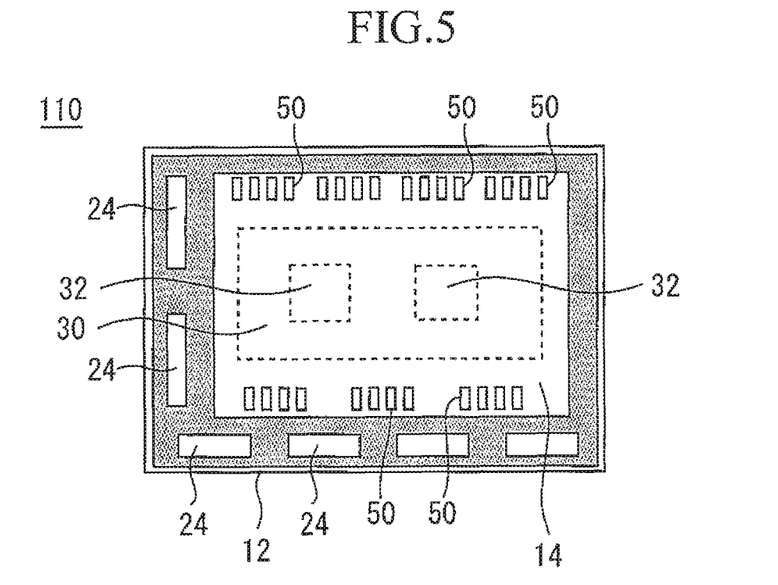
FIG. 5 is a diagram showing the semiconductor device according to the embodiment of the present invention.

FIG. 5 is a diagram showing the semiconductor device 110 according to the embodiment of the present invention. As shown in FIG. 5, a semiconductor device using press-fit terminals 50 as internal signal terminals may be provided. The semiconductor device 110 has a case 12 (in the form of a box in this device), a substrate 30 which is set in the case 12 and on which an electric circuit is formed, and a plurality of press-fit terminals 50 arranged in the case 12 while being spaced apart from each other. The printed circuit board 14 has a plurality of through holes and is superposed on the circuit substrate so that the press-fit portions 54 of the plurality of press-fit terminals 50 are respectively fitted in the plurality of though holes. Main terminals 24 are electrically connected to a circuit formed on the printed circuit board 14 and are exposed out of the case 12. The same construction as that of the semiconductor device shown in the comparative example with reference to FIG. 8 may be provided. That is, a construction may be provided in which a base plate 16 made of copper, semiconductor elements (semiconductor chips) 32, and a substrate (insulating substrate) 30 are stacked and the base portions 51 of the press-fit terminals 50 and the semiconductor elements 32 are electrically connected to each other by wires 22.

Figure 7:
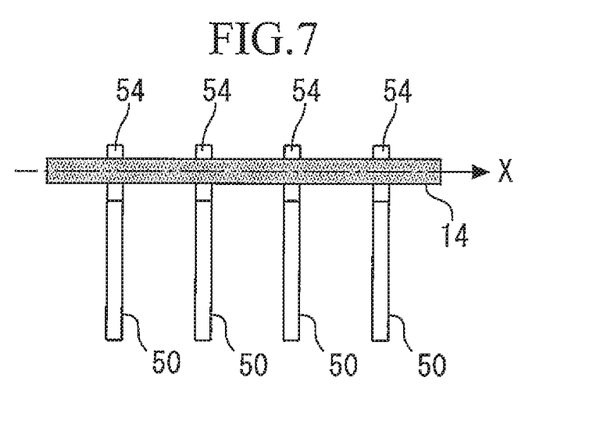
FIG. 7 is a side view of the printed circuit board.

FIGS. 6 and 7 are diagrams for explaining the action of the press-fit terminals 50 according to the embodiment of the present invention. FIGS. 6 and 7 show a state where electrical connections are established by fitting the press-fit terminals 50 in the through holes 14h of the printed circuit board 14. FIG. 6 is a plan view of the printed circuit board 14, and FIG. 7 is a side view of the printed circuit board 14 shown in FIG. 6. When the printing circuit board 14 is pressed for fitting, the press-fit terminals 50 are inserted in the through holes 14h while the broadened press-fit portions 54 of the press-fit terminals 50 are squeezed, as in the case described with respect to the comparative example with reference to FIGS. 17 to 19. This insertion operation in the present embodiment is not illustrated. Thereafter, electrical connections between the printed circuit board 14 and the press-fit terminals 50 are established by the elastic force of press-fit portions 54.

Forces are applied to the edges of the through holes 14h by the restitutive forces of the press-fit portions 54 when the press-fit portions 54 contract. Restitution directions E in which the press-fit portions 54 restitute from their contractions caused by press fitting are turned aside one from another so as not to be aligned with each other between each adjacent pair of the press-fit terminals 50. The points of contact between the press-fit portions 54 and the through hole edges can thereby be set remoter from each other between each adjacent pair of press-fit terminals 50 so that the points of contact are not concentrated in one place. The forces applied to the printed circuit board 14 by press fitting can thus be dispersed.

Use of the press-fit terminals 50 ensures that, in the semiconductor device 10 shown in FIG. 4, the pitch between the press-fit terminals 50 can be reduced in comparison with the comparative example shown in FIG. 15. An increase in density and a close layout of electronic component parts on a user-side circuit board (printed circuit board) assembled on the semiconductor device 10 can thereby be achieved.

Also in the semiconductor device 110 shown in FIG. 5, the terminal pitch can be reduced in comparison with the comparative example shown in FIG. 16 by using the press-fit terminals 50. As a result, an increase in density and a close layout of electronic component parts in the semiconductor device 110 can be achieved and the semiconductor device 110 itself can be reduced in size or the electronic parts mount area can be increased.

In joining by press fitting, the press-fit portions 54 are inserted in the through holes 14h by pressing the printed circuit board 14 from above the press-fit terminals 50, thus achieving contacts. At the time of insertion, stresses are caused in the printed circuit board 14 and the press-fit portions 54. Because of the risk of cracking of the press-fit portions 54, it is desirable to minimize excess stresses in the press-fit terminals 50 before insertion. In this respect, in the present embodiment, stresses caused in the press-fit terminals 50 when the press-fit portions 54 are set at the angle θ can be reduced by selecting, as a shape punched out from a metal plate, a shape such as shown in FIG. 1. Also, in the embodiment, setting at the angle θ can be made by bending the press-fit terminal plates 60, there is, therefore, no need for the step of twisting the press-fit terminals 50, and the number of working process steps can be reduced in comparison with the case of using the press-fit terminals 50 according to International Publication No. WO 2014/132803.

The semiconductor elements 32 included in the electric circuits in the semiconductor devices 10 and 110 may be formed of a wide-bandgap semiconductor. In particular, a wide-bandgap semiconductor other than silicon may be used as the material of the semiconductor elements 32. The wide-bandgap semiconductor comprises SiC, GaN or diamond. In general, such a wide-bandgap semiconductor has the advantage of being capable of being used at a high temperature.

A power conversion apparatus incorporating at least one of the above-described semiconductor devices 10 and 110 may be provided. Concrete examples of the power conversion apparatus are an inverter, a converter, a servo amplifier and a power supply unit. Thus, the terminal pitch of the semiconductor device can be reduced and the semiconductor device itself can be reduced in size, thereby enabling the unit to be reduced in size.

According to the present invention, the press-fit terminal is formed by bending the base portion and the trunk portion relative to each other while inclining the fold therebetween, so that a surface of the press-fit portion can be directed at a desired angle without twisting the terminal. The press-fit terminal having improved strength is thus provided.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a case;
   a circuit substrate set in the case and having an electric circuit formed thereon; and
   a plurality of terminals arranged in the case by being spaced apart from each other, each terminal having:
   a base portion electrically connected to the electric circuit in the case; and
   a trunk portion bent by forming a fold between the base portion and the trunk portion so as to rise from the base portion at the end of the base portion, the trunk portion having a press-fit portion formed at its distal end,
   wherein the fold is inclined relative to a longitudinal axis of the base portion, and
   wherein restitution directions in which the press-fit portions restitute from their contractions caused by press fitting are turned aside one from another between each adjacent pair of the terminals.

2. The semiconductor device according to claim 1, further comprising:
   another substrate having a plurality of through holes and superposed on the circuit substrate so that the press-fit portions of the plurality of terminals are respectively fitted in the plurality of through holes; and
   a main terminal electrically connected to a circuit formed on the other substrate and exposed out of the case.

3. The semiconductor device according to claim 1, wherein the press-fit portions of the plurality of terminals project out of the case from an upper surface of the case.

4. The semiconductor device according to claim 1, wherein the electric circuit includes a semiconductor element, and
   wherein the semiconductor element is formed of a wide-bandgap semiconductor.

5. A power conversion apparatus comprising at least one semiconductor device, the semiconductor device including:
   a case;
   a circuit substrate set in the case and having an electric circuit formed thereon; and
   a plurality of terminals arranged in the case by being spaced apart from each other, each terminal having:
   a base portion electrically connected to the electric circuit in the case; and
   a trunk portion bent by forming a fold between the base portion and the trunk portion so as to rise from the base portion at the end of the base portion, the trunk portion having a press-fit portion formed at its distal end, wherein the fold is inclined relative to a longitudinal axis of the base portion, and wherein restitution directions in which the press-fit portions restitute from their contractions caused by press fitting are turned aside one from another between each adjacent pair of the terminals.

6. A method of manufacturing a press-fit terminal, comprising:

a step of forming, by punching a metal plate with a die, a press-fit terminal plate in flat plate form having a base portion, a trunk portion connected to an end of the base portion and a press-fit portion provided on a distal end of the trunk portion, a longitudinal direction of the trunk portion being inclined relative to a longitudinal direction of the base portion; and a step of forming a press-fit terminal by bending the base portion and the trunk portion of the press-fit terminal plate relative to each other so that the trunk portion rises from the base portion at the end of the base portion, and so that a fold formed by bending is oblique to a longitudinal axis of the base portion.

7. A press-fit terminal comprising:

a base portion; and a trunk portion bent by forming a fold between the base portion and the trunk portion so as to rise from the base portion at the end of the base portion, the trunk portion having a press-fit portion formed at its distal end, wherein the fold is oblique to a longitudinal axis of the base portion.

* * * * *